United States Patent [19]

Ondris et al.

[11] Patent Number: 4,764,261
[45] Date of Patent: Aug. 16, 1988

[54] METHOD OF MAKING IMPROVED PHOTOVOLTAIC HETEROJUNCTION STRUCTURES

[75] Inventors: Miroslav Ondris, Chagrin Falls; Marty A. Hichler, Parma, both of Ohio

[73] Assignee: Stemcor Corporation, Cleveland, Ohio

[21] Appl. No.: 123,821

[22] Filed: Nov. 23, 1987

Related U.S. Application Data

[62] Division of Ser. No. 926,283, Oct. 31, 1986.

[51] Int. Cl.$^4$ .................... C25D 5/50; C25D 9/04; H01L 31/18
[52] U.S. Cl. .................... 204/37.1; 204/2.1; 204/37.6; 204/38.1; 204/40; 204/86; 437/5
[58] Field of Search .................... 204/2.1, 37.1, 38.1, 204/37.6, 38.4, 40, 86; 437/5; 136/255, 258 PC, 260, 264, 265; 357/16, 30 E

[56] References Cited

U.S. PATENT DOCUMENTS

| | | | |
|---|---|---|---|
| 4,388,483 | 6/1983 | Basol et al. | 136/260 |
| 4,400,244 | 8/1983 | Kroger et al. | 204/2.1 |
| 4,425,194 | 6/1984 | Kroger et al. | 204/2.1 |
| 4,548,681 | 10/1985 | Basol et al. | 204/2.1 |
| 4,596,645 | 6/1986 | Stirn | 204/192 S |
| 4,642,140 | 2/1987 | Noufi et al. | 148/6.24 |
| 4,710,589 | 12/1987 | Meyers et al. | 136/258 PC |

FOREIGN PATENT DOCUMENTS

53-54995  5/1978  Japan .................... 136/260

OTHER PUBLICATIONS

Loferski, Theoretical & Experimental Studies of Tandem or Cascade Solar Cells: A Review, Conf. Rec. 16th IEEE Photovoltaic Spec. Conf., pp. 648–654 (1982).
Wiedeman et al., Achievement of Higher Efficiency Amorphous Silicon–Germanium Solar Cells Using Affinity Gradients, Conf. Rec. 17th IEEE Photovoltaic Spec. Conf., pp. 223–228 (1984).
Wolf, Designing Practical Silicon Solar Cells Approaching the "Limit Conversion Efficiency", Conf. Rec. 14th IEEE Photovoltaic Spec. Conf., pp. 563–568 (1980).
Spitzer et al., Theoretical Limit Efficiency of Direct Gap Solar Cells, Conf. Rec. 14th IEEE Photovoltaic Spec. Conf., pp. 585–590 (1980).
Spitzer et al., Ultra High Efficiency Thin Silicon P-N Junction Solar Cells Using Reflecting Surfaces, Conf. Rec. 14th IEEE Photovoltaic Spec. Conf., pp. 375–380 (1980).

(List continued on next page.)

*Primary Examiner*—Aaron Weisstuch
*Attorney, Agent, or Firm*—Jeffrey A. Wyand; Joseph G. Curatolo; Larry W. Evans

[57] ABSTRACT

A three layer, photovoltaic structure having polycrystalline semiconductor layers disposed in series optically and in sequential touching contact includes a relatively wide optical bandgap energy window layer, a light-absorbing layer and a third, relatively wide bandgap energy layer that forms a minority carrier mirror with the light-absorbing layer. All three layers have different compositions so that the structure includes two heterojunctions. The light-absorbing layer and third layer are of the same conductivity type. The structure is conveniently realized using II–VI semiconductor compounds such as a cadmium sulfide or zinc sulfide window layer, a mercury cadmium telluride, cadmium telluride, zinc cadmium telluride or mercury zinc telluride light-absorbing layer and a third layer of cadmium telluride, zinc telluride, zinc cadmium telluride, mercury cadmium telluride or cadmium manganese telluride. Cadmium is present in at least two of the three layers of the novel structures. Tellurium is present in two of the three layers. Structures according to the invention may be conveniently formed by electrodeposition and may employ opaque or transparent substrates depending on the particular semiconductor materials used and their relative positions.

7 Claims, 1 Drawing Sheet

OTHER PUBLICATIONS

Arndt et al., Large Bandgap Polycrystalline Thin Film Solar Cells for Tandem Structures, Tech. Digest. Inter'l PV SEC-1, pp. 361-364 (1984).

Razykov et al., Photovoltaic Effect in Heterojunctions Made of Zinc and Cadmium Telluride, 17 Sov. Phys. Semiconductions, pp. 585-586 (1983).

Nakayama et al., "Screen Printed Thin Film CdS/CdTe Solar Cell", Jap. J. App. Physics, vol. 19, pp. 703-712 (1980).

Radojcic et al., "Preparation and Properties of Graded Band Gap $CdS_xTe_{1-x}$ Thin Film Solar Cells, Solar Cells, vol. 4, pp. 121-126 (1981).

Meyers, "Polycrystalline CdS/CdTe/ZnTe n-i-p Solar Cell", 7th European Photovoltaic Conf., Seville, Spain, Oct. 1986.

Zweibel et al., Polycrystalline Thin-Films: FY1985 Annual Report, SERI, pp. 21-26 (Feb. 1986).

Coutts et al., eds, Current Topics in Photovoltaics (1985), pp. 10-12.

METHOD OF MAKING IMPROVED PHOTOVOLTAIC HETEROJUNCTION STRUCTURES

This is a division of co-pending patent application Ser. No. 926,283 filed Oct. 31, 1986.

BACKGROUND

Photovoltaic technology offers great potential as an alternative source of electrical energy. That potential has not yet been realized because of the difficulty in making photovoltaic devices that efficiently transform light, such as sunlight, into electricity at a cost that is competitive with conventional energy sources where they are available. Accordingly, researchers are continually striving to improve the efficiency of photovoltaic structures.

With respect to junction photovoltaic devices prepared from semiconductor materials, various approaches have been taken to improve efficiency. For example, photovoltaic structures including several cells connected in series both electrically and optically, with respect to incident light, yield improved efficiency, but at a higher cost of production.

Certain idealized semiconductor structures have been proposed based on particular theoretical energy band configurations that would produce improved efficiency. However, selecting materials that can produce the desired energy band configurations and actually making examples of the idealized structures are problems that have not been solved before. One such theoretical band configuration employs a three layer structure having a wide bandgap energy window layer for passing light without significant loss. The next lower layer, lower with respect to the direction of light incidence, employs a different material having an optical bandgap energy selected to maximize absorption from the spectrum of incident light. A final, still lower or deeper layer, of the same conductivity type as the middle layer, but formed of a different material, acts to aid collection of majority charge carriers, but impede the collection of minority carriers. This heterojunction between the middle and deepest layer is sometimes referred to as a minority carrier mirror since it, in effect, reflects minority carriers.

The promise of the idealized three layer structure described has not been previously realized. The number of available semiconductor materials from which to select is limited. The deposition processes for the available materials considered to date to produce the desired energy band configuration usually result in the creation of deleterious interfaces between the different materials.

SUMMARY OF THE INVENTION

In the invention, polycrystalline semiconductor materials are used to produce a structure having the desired energy band configuration and improved efficiency performance. Embodiments of the improved structure have been prepared by employing electrodeposition technology and show the desired improvement in performance.

The desired energy band configuration is achieved according to the invention in a three layer polycrystalline structure, each layer being composed of a different semiconductor compound. Two adjacent touching layers are of the same conductivity type and the other layer is of the opposite conductivity type. At least two of the layers contain cadmium and at least two of the layers contain tellurium as a principal constituent of the compound. The compounds form heterojunctions at the junctions between the layers. The relatively wide optical bandgap energy material is advantageously n-type cadmium sulfide or n-type cadmium sulfide containing zinc in place of some of the cadmium. The middle layer in which most of the absorption of light energy occurs to produce charge carriers is advantageously chosen to be n- or p-type cadmium telluride, cadmium telluride in which some of the cadmium is replaced by one of the mercury and zinc or zinc telluride in which some of the zinc is replaced by mercury. The deepest layer of the novel structures may be p-type cadmium telluride in which none, some or all of the cadmium atoms are replaced by zinc or in which some of the cadmium atoms are replaced by mercury or manganese, provided that the compositions of the middle and deepest layers are different. Where there is a substitution of a different element for some of the cadmium atoms in any of the layers, but particularly in the middle layer, the amount of that substitution may vary along a line passing through the layer and connecting the heterojunctions. This concentration gradient may improve charge carrier collection efficiency, and/or the thermal expansion coefficient and/or crystalline lattice match between adjacent layers. Light conversion efficiency in excess of 9 percent has been acheived in a structure prepared according to the invention from electrodeposited layers of cadmium sulfide, mercury cadmium telluride and cadmium telluride.

DETAILED DESCRIPTIONS OF PREFERRED EMBODIMENTS

It is known in the art of semiconductor photovoltaic devices that multiple layer cells arranged in series optically provide certain advantages. The layers are referred to as in series optically because incident light enters one of the layers and after passing through that layer enters the next layer, etc., until it has passed through all the layers or is entirely absorbed. The top layer, i.e. the layer that first receives incident light, preferably has a wide optical bandgap energy so that little of the incoming light from the sun or another light source is absorbed in that layer. For passage of sunlight, it is desired that the optical bandgap energy of the first layer be relatively large, perhaps 2.4 electron-volts (eV) or more. The top layer functions as an electrical contact for collecting light generated charge carriers. The next deeper layer, deeper with respect to the direction of travel of light, has a smaller optical bandgap energy, preferably one that is selected to optimize absorption of the incident light considering its spectral distribution. Most of the incident light is absorbed in that layer and generates electronic charge carrier pairs that are collected at the terminals of the device as the photovoltaic current. For the solar spectrum, an ideal optical bandgap energy for the middle layer is about 1.4 to 1.5 eV. If the three layer structure is used as a unit cell in a cascade structure incorporating several unit photovoltaic cells arranged in series optically, then the bandgap energies of the middle layers of each of the unit cells should be different, with the narrowest bandgap energy material being disposed in the deepest cell. Since in the unit cell the optical bandgap energies of the top and middle layers are different, it is obvious that the layers in the desired structure are each formed of different materials. Therefore, their interfaces are heterojunctions. Likewise, it is obvious that for the three layer structure being described, it is necessary that the top and middle layer form a rectifying junction, i.e. be of opposite conductivity types, in order to achieve acceptable photovoltaic performance.

The deepest layer preferably forms with the middle layer a minority charge carrier mirror. The minority carrier mirror "reflects" minority carriers back toward the middle layer, but encourages collection of majority carriers. The effect is to reduce the diode saturation current, enhancing the open circuit voltage and, thereby, the efficiency of a photovoltaic cell. Such charge carrier mirrors are known in the art and are achieved by making the conductivity types of the middle and deepest layer the same and more strongly doping the deepest layer relative to the doping level of the middle layer. Use of a heterojunction at the junction of the middle and deepest layers is an alternative and supplementary method of realizing a minority carrier mirror.

Figure 1:
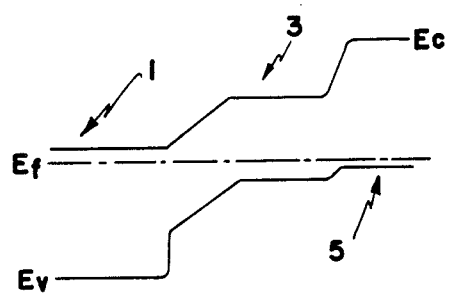
FIG. 1 is a diagram of an idealized configuration of energy band edges of an improved photovoltaic structure.

An energy band edge diagram of the three layer structure just described, i.e. with three layers disposed in sequential touching contact and optically in series, is shown in FIG. 1. There, the conventional Fermi level, $E_F$, is shown at equilibrium as a constant energy level throughout the three regions of the structure. In accordance with the usual convention, the conduction band edge, $E_c$, is shown disposed above the Fermi level and the valence band edge, $E_v$, is shown below the Fermi level. In region 1, i.e. the top layer, the wide optical bandgap energy material is shown as n-type material, i.e. a material in which electrons are the majority charge carriers. In region 3, i.e., the middle layer, a relatively narrow gap p-type material is shown. The band edges between regions 1 and 3 are oblique because the transition in conductivity types between the regions forms a space charge region. The space charge region sweeps charge carriers generated by absorbed light toward the terminals of the structure aiding their collection.

In addition, there is a discontinuity in the valence band edge because of the heterojunction, i.e. the narrowing of bandgap energies as the depth of light penetration in the cell increases. The discontinuity occurs in the valence band edge by judicious choice of the materials forming regions 1 and 3, bearing in mind their respective electron affinities. Preferably the electron affinity of the material in region 1 should be greater than that of the material in region 3. However, the electron affinity of the material of region 1 can be smaller than that of region 3, but not more than about 0.1 eV smaller. According to the rule commonly applied, the difference in the electron affinities of the two materials equals the discontinuity in the valence band edges between the region 1 and 3. However, it is also recognized that that rule is not always applicable.

In region 5, the deepest layer of the structure with respect to the direction of light penetration, is another p-type material that is of wider bandgap energy. Preferably, the Fermi level in region 5 is closer to the valence band edge than in region 3. The material in region 5 has a smaller electron affinity than the material in region 3, accounting for the discontinuity the conduction band edge. It is this discontinuity that acts as a minority charge carrier mirror.

Figure 2:
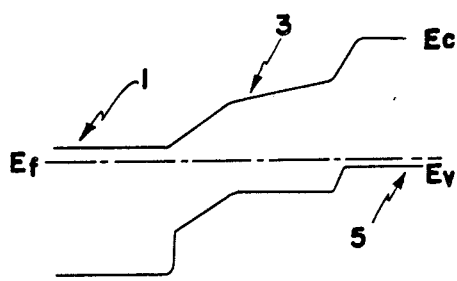
FIG. 2 is a diagram of another idealized configuration of energy band edges of an improved photovoltaic structure.

Constructing a three layer structure having an energy band configuration like the idealized diagram shown in FIG. 1 requires numerous practical considerations. Layers 1 and 3 and layers 3 and 5 should preferably have nearly the same thermal coefficients of expansion and lattice constants (assuming ordered and not amorphous materials are used). For example, in the case of a lattice constant mismatch, interface states can be created at the heterojunction that adversely affect the performance characteristics of the structure. An undesirably high concentration of interface states can result in excessive charge carrier recombination, severely reducing collected current. When materials containing at least three principal constituents (i.e. elements that are present in amounts to form a significant part of the atomic lattice and not in relatively small quantities as dopants or trace contaminants) are used in a layer, the relative amounts of two of the constituents can vary with position in one of the layers, such as the middle layer. An example is illustrated in FIG. 2, where the middle layer has an optical bandgap energy that varies with position along the direction of a line connecting the two heterojunctions. As a result of that variation, at least one band edge is tilted and therefore aids collection of charge carriers. The compositional variation can also reduce the effects of mismatches in thermal expansion coefficients and/or in lattice constants.

Figure 3:
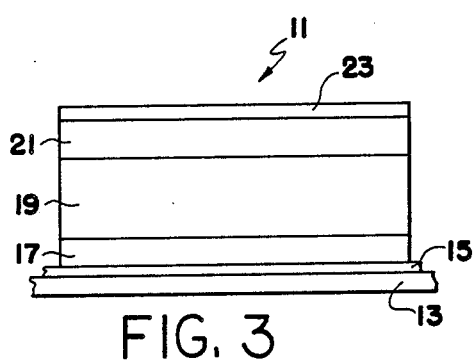
FIG. 3 is a cross sectional schematic view of an embodiment of a device according to the invention.

The structure described needs additional physical elements to function as a photovoltaic cell. An example of a completed unitary cell device 11 incorporating the structure is shown in FIG. 3. Device 11 includes a substrate 13 on which, if necessary, an electrically conducting layer 15 is disposed. The three layers 17, 19 and 21 of the novel structure are disposed on conductive layer 15 and a second conductive layer 23 is disposed on layer 21. Substrate 13 may be transparent, such as glass, or may be opaque. In the former case, light passes through the substrate into layer 17 which may be the top cell of the structure. A transparent dielectric substrate 13 requires a transparent, electrically conducting layer 15 to form one terminal of device 11. Appropriate conducting layers can be made from tin oxide, indium tin oxide, zinc oxide and other transparent, electrically conducting oxides as is well known in the art. In an inverted form of device 11, layer 21 may be the top layer in which case layer 23 may be transparent, as well as electrically conductive, and may be in the form of or include a current collecting grid. In this case, substrate 13 may be opaque and electrically conducting, meaning that layer 15 may be unnecessary.

The problem in realizing the idealized three layer structure described is the selection of available semiconductor materials that have the characteristics described and can be united in the structure without loss of performance. By means of the invention, the structure can be realized using polycrystalline semiconductor materials. The so-called II-VI polycrystalline semiconductors (referring to the IIB and VIA columns of the Periodic Table of Elements as published by the American Chemical Society) that can be prepared by electrodeposition can be used to construct the structure and achieve the performance that previously has only been discussed theoretically.

An appropriate material for the "top", i.e. window, layer of a structure according to the invention is cadmium sulfide which has an optical bandgap energy greater than 2 eV. Cadmium sulfide can be deposited by numerous methods including electrodeposition and plasma spraying. Cadmium sulfide can be modified by substituting zinc for some of the cadmium atoms, i.e. to form $Cd_yZn_{1-y}S$, where y ranges from more than zero to no more than one, resulting in an increase in optical bandgap energy with increasing zinc. These materials generally exhibit n-type conductivity.

In a unit cell, as shown in FIG. 3, when cadmium sulfide is used as the top layer, zinc oxide can be used advantageously as the electrically conductive transparent film 15. It is desirable that the cadmium sulfide layer be as thin as possible to minimize the amount of light absorbed in the top layer and be heavily doped to minimize ohmic losses. However, a charge depletion region is formed at the junction of the top and middle layers of the cell when those layers are of opposite conductivity types. If the cadmium sulfide layer is very thin and not too heavily doped, the depletion layer can extend almost all the way through the cadmium sulfide layer. However, because zinc oxide has a different electron affinity from that of tin oxide, with or without indium, its use is preferred since with it a thinner cadmium sulfide layer may be used.

Cadmium telluride alone and with the substitution by one of mercury and zinc for some of the cadmium atoms and mercury zinc telluride are appropriate materials for the middle or photovoltaic layer of the structure in which most of the light is absorbed. The optical bandgap energy of cadmium telluride is about 1.5 eV which is nearly ideal for absorption of light from the solar spectrum. Cadmium telluride may be electrodeposited on a conducting substrate, such as on a layer of cadmium sulfide, using known technology. See U.S. Pat. Nos. 4,388,483, to Basol et al., 4,400,244 to Kroger et al. and 4,425,194 to Kroger et al., the disclosures of which are incorporated herein by reference. Inclusion of mercury in place of some of the cadmium can reduce the optical bandgap energy of cadmium telluride to an even more optimal value for light absorption from the solar spectrum. A method for electrodepositing mercury cadmium telluride, $Cd_xHg_{1-x}Te$ where x ranges from more than zero to less than one, is disclosed in U.S. Pat. No. 4,548,681 to Basol et al., which is incorporated herein by reference. Similarly $Cd_xZn_{1-x}Te$ and $Hg_xZn_{1-x}Te$ where x ranges from more than zero to less than one, are suitable for use in the photovoltaic layer. $Cd_xZn_{1-x}Te$ and $Hg_xZn_{1-x}Te$ can be electrodeposited generally following the techniques disclosed in the Kroger and Basol patents. Some or all of the cadmium ions in the electroplating bath must be replaced by different concentrations of zinc or mercury and the plating potentials must be adjusted because of the different quasi-rest potentials of zinc and mercury compared to that of cadmium. These middle layer materials are generally n-type when electrodeposited. However, if heat treated for sufficient time at a high enough temperature, as described in U.S. Pat. Nos. 4,388,483 and 4,548,681, for CdTe and CdHgTe, these materials can be converted to p-type conductivity.

The deepest layer of the structure can be formed of cadmium telluride, zinc telluride (generally $Cd_zZn_{1-z}Te$), $Cd_zHg_{1-z}Te$ or $Cd_zMn_{1-z}Te$ where z is more than zero and no more than one. The appropriate material depends on the material used in the middle, photovoltaic layer. The energy bandgap of zinc telluride is about 2.3 eV and it forms a continuous series of compounds with cadmium telluride. 17 Sov. Phys. Semiconductors, #5, pp. 585–86 (1983). Therefore, by adjusting the ratio of zinc to cadmium, an optical bandgap energy greater than that of cadmium telluride can be achieved. Of course, if the bandgap energy of the light-absorbing material in the middle layer is less than that of cadmium telluride, as is the case with mercury cadmium telluride, then the deepest layer of the structure can be cadmium telluride. Zinc telluride characteristically exhibits p-type conductivity and, as previously explained, electrodeposited cadmium telluride usually has n-type conductivity, but can be converted to p-type conductivity with a heat treatment.

Electrodeposition is a particularly advantageous method of preparing structures according to the invention. Electrodeposition processes are carried out at temperatures of no more than about 100° C. Preferably, a deposited layer is very quickly transferred from one electrodeposition bath to another for growing the next layer. The very limited exposure time between the deposition of different layers and the relatively low temperatures used, discourage the formation of oxides or other interfacial layers that could adversely affect the performance of the resulting structure. Any heat treatment step for conductivity type conversion of any of the layers is preferably carried out after all layers are deposited rather than between deposition of different layers. Other low temperature deposition processes are also expected to produce structures according to the invention having good performance characteristics.

Particularly appropriate combinations of materials for the layers of the novel polycrystalline photovoltaic structure are listed in Table I.

TABLE I

Examples of Structures In Accordance With the Invention

| Example | Layer A | Middle Layer | Layer B |
|---|---|---|---|
| 1 | n CdS | p $Cd_xHg_{1-x}Te$ | p CdTe |
| 2 | n CdS | p $Cd_xHg_{1-x}Te$ | p $Cd_zHg_{1-z}Te$ |
| 3 | n CdS | n CdTe | p ZnTe |
| 4 | n CdS | p CdTe | p $Cd_zZn_{1-z}Te$ |
| 5 | n $Cd_yZn_{1-y}S$ | p $Cd_xZn_{1-x}Te$ | p $Cd_zZn_{1-z}Te$ |
| 6 | n $Cd_yZn_{1-y}S$ | p $Cd_xHg_{1-x}Te$ | p $Cd_zZn_{1-z}Te$ |
| 7 | n CdS | p CdTe | p $Cd_zMn_{1-z}Te$ |
| 8 | n CdS | p $Hg_xZn_{1-x}Te$ | p $Cd_zZn_{1-z}Te$ |

Thus it is noted that the preferred polycrystalline semiconductor materials employed in these structures include cadmium as a principal constituent in at least two and, frequently, all three of the layers. Likewise, sulfur is always present as a principal constituent in one of the layers. Tellurium is present as a principal constituent in two of the layers. Selenium is never intentionally present in any of the layers. Selenium can migrate during deposition processes and during heat treatment of layers, creating unwanted interfaces or junctions that adversely affect performance of the structure.

Structures having middle layers including three chemical elements can have the graded energy band structure of FIG. 2. The grading is accomplishing by varying the relative quantities of the two group II elements that are present in the layer, e.g. Cd and Hg, Cd and Zn, along a line passing through the middle layer and connecting the two heterojunctions. With respect to Examples 2 and 5, z must be greater than x or the minority carrier mirror will not be formed.

Example 3 in Table I is a somewhat different structure from the other examples. In Examples 1, 2 and 4-8, layer A is the window layer through which light first enters the structure. This arrangement is apparent since in those examples the window layer and the light-absorbing layer are of opposite conductivity types. In the desired structure, the light-absorbing layer and layer that form the minority carrier mirror are of the same conductivity type. In Example 3, the same conductivity type layers are layer A and the middle layer. In the other examples, the same conductivity type layers are the middle layer and layer C. That is, Example 3 is an "upside down" structure relative to the other examples. It can be formed on an opaque substrate assuming, as is conventional, that the cadmium sulfide layer is deposited first. A molybdenum substrate or thin layer of molybdenum disposed on another substrate is an appropriate base for a photovoltaic cell using the structure of Example 3. The middle layer is kept n-type by avoiding any processing steps at temperatures sufficiently elevated to convert the conductivity type of the cadmium telluride middle layer. With the other examples of Table I, it is contemplated that glass or another transparent substrate bearing a transparent, electrically conductive layer, if necessary, will be used with the structures in photovoltaic cells. In that case, the layers will be usually be deposited in the sequence of layer A, middle layer and layer B sequence.

Figure 4:
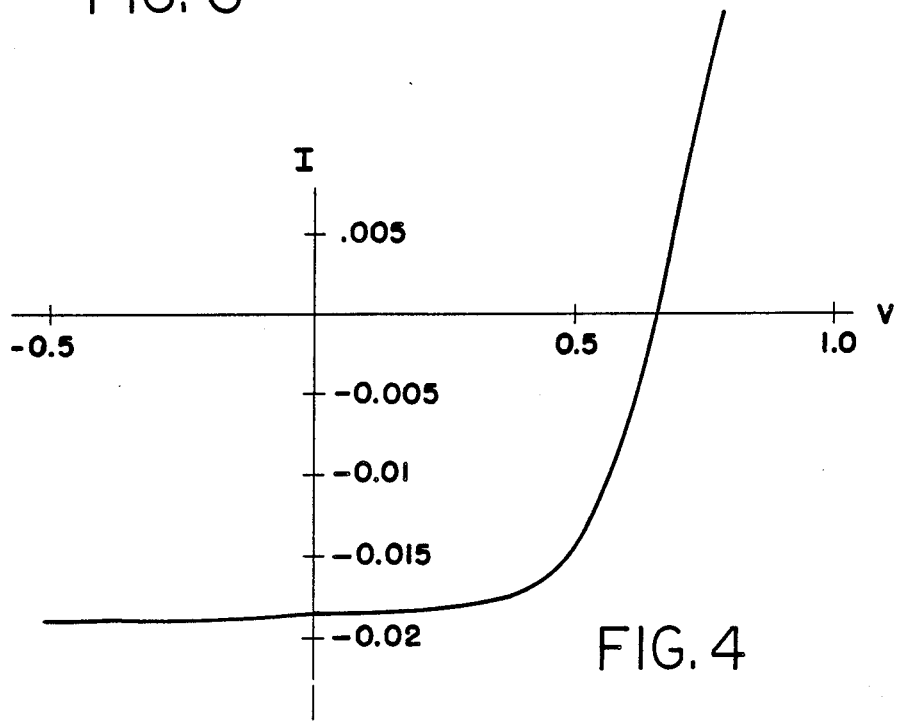
FIG. 4 is a plot of measured performance results for a photovoltaic device including a structure in accordance with the invention.

FIG. 4 displays the measured performance characteristics of a photovoltaic device having a single cell constructed of the materials of the Example 1 type from Table I. The electrical contacts forming the electrical terminals of the devices were indium tin oxide contacting the cadmium sulfide and gold contacting the cadmium telluride. This heterojunction cell hss the characteristics listed in Table II. The efficiencies of cells according to the invention have shown about 10% improvement in efficiency compared to similar cells without a minority carrier mirror. The efficiency improvement is largely attributable to increases in open circuit voltage and, to a lesser degree, improvements in fill factor.

TABLE II

| Measured Characteristics of an Embodiment of a Photovoltaic Cell In Accordance with The Invention | |
|---|---|
| | FIG. 4 |
| Efficiency (percent) | 9.7 |
| Open circuit voltage (volts) | .64 |
| Short circuit current (mA) | 1.8 |
| Fill factor | 0.58 |

The foregoing description concerns a three layer photovoltaic structure that can be part of a photovoltaic device. One such structure may be incorporated in a single cell photovoltaic device or several of the three layer structures may be included in a multiple cell, cascade device with the cells arranged in optical series and, perhaps, connected in series electrically.

The invention has been described with respect to certain preferred embodiments. Various modifications and additions within the spirit of the invention will occur to those of skill in the art. Accordingly, the scope of the invention is limited solely by the following claims.

I claim:

1. A method of preparing an improved photovoltaic structure comprising:
   depositing a layer of cadmium sulfide on an electrically conducting substrate;
   electrodepositing a layer of $Cd_xHg_{1-x}Te$ on said layer of cadmium sulfide, wherein x ranges from greater than zero to less than one; and
   electrodepositing a layer of one of cadmium telluride and $Cd_zHg_{1-z}Te$ on said layer of $Cd_xHg_{1-x}Te$, where z is greater than x when $Cd_zHg_{1-z}Te$ is deposited.

2. The method of claim 1 including heat treating said structure to change the conductivity type of said layers containing cadmium and tellurium.

3. A method of preparing an improved photovoltaic structure comprising:
   depositing a layer of cadmium sulfide on an electrically conducting substrate;
   electrodepositing a layer of cadmium telluride on said layer of cadmium sulfide; and
   electrodepositing a layer of $Cd_zZn_{1-z}Te$, where z ranges from zero to less than one, on said layer of cadmium telluride.

4. The method of claim 3 including heat treating said cadmium telluride layer to change its conductivity type.

5. The method of claim 3 including heat treating said structure at a sufficiently high temperature to improve the performance of said structure, but below the temperature necessary to change the conductivity type of said cadmium telluride layer.

6. A method of preparing an improved photovoltaic structure comprising:
   depositing a first layer of $Cd_yZn_{1-y}S$ on an electrically conducting substrate, where y ranges from more than zero to no more than one;
   electrodepositing a second layer of one of $Cd_xZn_{1-x}Te$, $Cd_xHg_{1-x}Te$ and $Hg_xZn_{1-x}Te$ on said first layer, where x ranges from greater than zero to less than one; and
   electrodepositing a layer of $Cd_zZn_{1-z}Te$ on said second layer, where z ranges from greater than zero to no more than one, and z is greater than x when both the second and third layers contain zinc.

7. The method of claim 6 including heat treating said structure to change the conductivity type of at least one of said layers containing cadmium and tellurium.

* * * * *